(12) United States Patent
Lee et al.

(10) Patent No.: US 8,053,091 B2
(45) Date of Patent: Nov. 8, 2011

(54) HYPERBRANCHED POLYMER, ORGANIC LIGHT-EMITTING DIODE INCLUDING ORGANIC LAYER INCLUDING THE HYPERBRANCHED POLYMER, AND METHOD OF MANUFACTURING THE ORGANIC LIGHT-EMITTING DIODE

(75) Inventors: Tae-Woo Lee, Yongin-si (KR); Jong-Jin Park, Yongin-si (KR); Shinichiro Tamura, Yongin-si (KR); Masa-aki Kakimoto, Tokyo (JP)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 822 days.

(21) Appl. No.: 12/076,854

(22) Filed: Mar. 24, 2008

(65) Prior Publication Data

US 2008/0290338 A1    Nov. 27, 2008

(30) Foreign Application Priority Data

May 22, 2007    (KR) .................. 10-2007-0049942

(51) Int. Cl.
*H01L 35/24* (2006.01)
*H01L 49/00* (2006.01)
*C08G 75/00* (2006.01)

(52) U.S. Cl. ........ 428/690; 428/917; 313/504; 313/506; 257/40; 257/E25.008; 528/171; 438/99

(58) Field of Classification Search .................. None
See application file for complete search history.

(56) References Cited

U.S. PATENT DOCUMENTS 5,300,575 A    4/1994   Jonas et al.
5,366,811 A *  11/1994  Higashi et al. ................ 428/457

FOREIGN PATENT DOCUMENTS

JP    2002-293890    * 10/2002

(Continued)

OTHER PUBLICATIONS

Sugiyama et al., Transactions of the Materials Research Society of Japan, 33(4), (2008), pp. 1317-1320.*

(Continued)

*Primary Examiner* — Dawn L Garrett
(74) *Attorney, Agent, or Firm* — Robert E. Bushnell, Esq.

(57) ABSTRACT

Provided are a hyperbranched polymer represented by Formula 1 below, an organic light-emitting diode including an organic layer including the hyperbranched polymer, and a method of manufacturing the organic light-emitting diode:

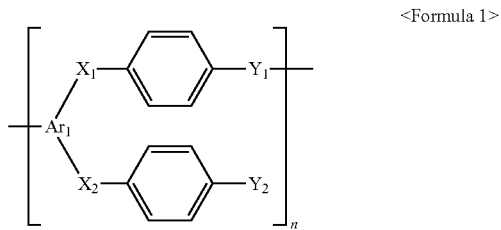

<Formula 1>

For a detailed description about Formula 1, the Detailed Description of the Invention may be referred to. The hyperbranched polymer is excellent in view of hole injection capability and/or electron blocking capability and adhesion with an electrode, and thus, the organic light-emitting diode including the organic layer including the hyperbranched polymer can have good electrical properties.

19 Claims, 3 Drawing Sheets

FOREIGN PATENT DOCUMENTS

| | | | |
|---|---|---|---|
| JP | 2007-332334 | * | 12/2007 |
| KR | 10-2006-0091220 | | 8/2006 |

OTHER PUBLICATIONS

Jianxin et al., Polymer Science, Series A, vol. 48, No. 10, (2006), pp. 1035-1040.*

Jianxin et al., Polymer Science, Series B, vol. 49, No. 7-8, pp. 203-208, Date: 2007.*

Aharoni et al., Macromolecules, (1990), vol. 23, pp. 2533-2549.*

Takeuchi et al., Chemistry Letters, vol. 32, No. 3, (2003), pp. 242-243.*

* cited by examiner

HYPERBRANCHED POLYMER, ORGANIC LIGHT-EMITTING DIODE INCLUDING ORGANIC LAYER INCLUDING THE HYPERBRANCHED POLYMER, AND METHOD OF MANUFACTURING THE ORGANIC LIGHT-EMITTING DIODE

CLAIM OF PRIORITY

This application makes reference to, incorporates the same herein, and claims all benefits accruing under 35 U.S.C. §119 from an application for earlier filed in the Korean Intellectual Property Office on May 22, 2007 and there duly assigned Serial No. 10-2007-0049942.

BACKGROUND OF THE INVENTION

1. Field of the Invention

The present invention relates to a hyperbranched polymer, an organic light-emitting diode including an organic layer including the hyperbranched polymer, and a method of manufacturing the organic light-emitting diode. More particularly, the present invention relates to a hyperbranched polymer which has excellent hole injection capability and/or electron blocking capability and adhesive property with an electrode and which can be dissolved in an organic solvent, an organic light-emitting diode including an organic layer including the hyperbranched polymer, and a method of manufacturing the organic light-emitting diode. With the hyperbranched polymer, an organic light-emitting diode having good electrical properties can be produced. An organic layer including the hyperbranched polymer can be formed by a simple wet process, such as spin coating, under a moisture-free inert gas atmosphere. Thus, it is possible to reduce the time and cost of manufacturing an organic light-emitting diode and to improve the stability of diode manufacture by preventing diode deterioration due to moisture.

2. Description of the Related Art

Organic light-emitting diodes include a pair of electrodes and an organic layer interposed between the electrodes. The organic light-emitting diodes are self-emission devices based on the principle that when current is applied to the electrodes, electrons and holes from the electrodes are combined in the organic layer to emit light. The organic light-emitting diodes have advantages such as lightness, simple constitutional elements, easy fabrication process, superior image quality, and wide viewing angle. In addition, the organic light-emitting diodes can achieve high color purity, can perfectly create dynamic images, and have electrical properties suitable for portable electronic equipment due to low power consumption and low driving voltage.

Generally, organic light-emitting diodes are structured such that an anode is disposed on a substrate, an organic layer, such as a hole injection layer, a hole transport layer, an emitting layer, an electron transport layer, and an electron injection layer, is disposed on the anode, and a cathode is disposed on the organic layer.

For example, a hole injection layer forming material may be PEDOT:PSS (poly(3,4-ethylenedioxythiophene):poly(styrenesulfonate)) (see U.S. Pat. No. 5,300,575).

PEDOT:PSS can be deposited using a wet process such as spin coating, but is a water-soluble material and thus is very vulnerable to moisture. Thus, when a hole injection layer is formed of PEDOT:PSS, impurities such as moisture may be easily contained in the hole injection layer. Since moisture etc. can adversely affect the efficiency and lifetime of an organic light-emitting diode, there is room for improvement in a hole injection layer material.

SUMMARY OF THE INVENTION

The present invention provides a hyperbranched polymer which has excellent hole injection capability and/or electron blocking capability and adhesive property with an electrode and which can be dissolved in an organic solvent. The present invention also provides an organic light-emitting diode including an organic layer including the hyperbranched polymer and a method of manufacturing the organic light-emitting diode.

According to an aspect of the present invention, there is provided a hyperbranched polymer represented by Formula 1 below:

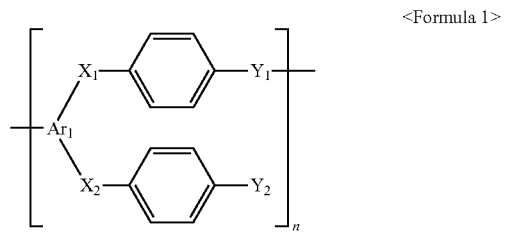

<Formula 1> wherein, $Ar_1$ is a substituted or unsubstituted $C_6$-$C_{20}$ arylene group or a group represented by —($R_1$)—N($R_2$)—$R_3$— where $R_1$ and $R_3$ are each independently a substituted or unsubstituted $C_6$-$C_{20}$ arylene group, and $R_2$ is a substituted or unsubstituted $C_6$-$C_{20}$ aryl group;

$X_1$ and $X_2$ are each independently a divalent linking group selected from the group consisting of O, S, $CH_2$, CO, $SO_2$, and NHCO;

$Y_1$ is CO, $SO_2$, or $PO_3$;

$Y_2$ is $CO_2H$, $SO_3H$, or $PO_3H$; and n is an integer of 2 to 10,000.

According to another aspect of the present invention, there is provided an organic light-emitting diode including a substrate, a first electrode, an organic layer including the above-described hyperbranched polymer, an emitting layer, and a second electrode.

According to another aspect of the present invention, there is provided a method of manufacturing an organic light-emitting diode, the method including:

forming a first electrode on a substrate;

forming an organic layer including the above-described hyperbranched polymer on the first electrode by coating a solution including the hyperbranched polymer and an organic solvent on the first electrode and baking the resultant under an inert gas atmosphere;

forming an emitting layer on the organic layer; and forming a second electrode on the emitting layer.

The hyperbranched polymer is excellent in view of hole injection capability and/or electron blocking capability and adhesion with an electrode, and thus, the organic light-emitting diode including the organic layer including the hyperbranched polymer can exhibit good emission efficiency. In addition, the hyperbranched polymer can be dissolved in an organic solvent, and thus, the organic layer including the hyperbranched polymer can be formed using a simple wet process, such as spin coating, under an inert gas atmosphere.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
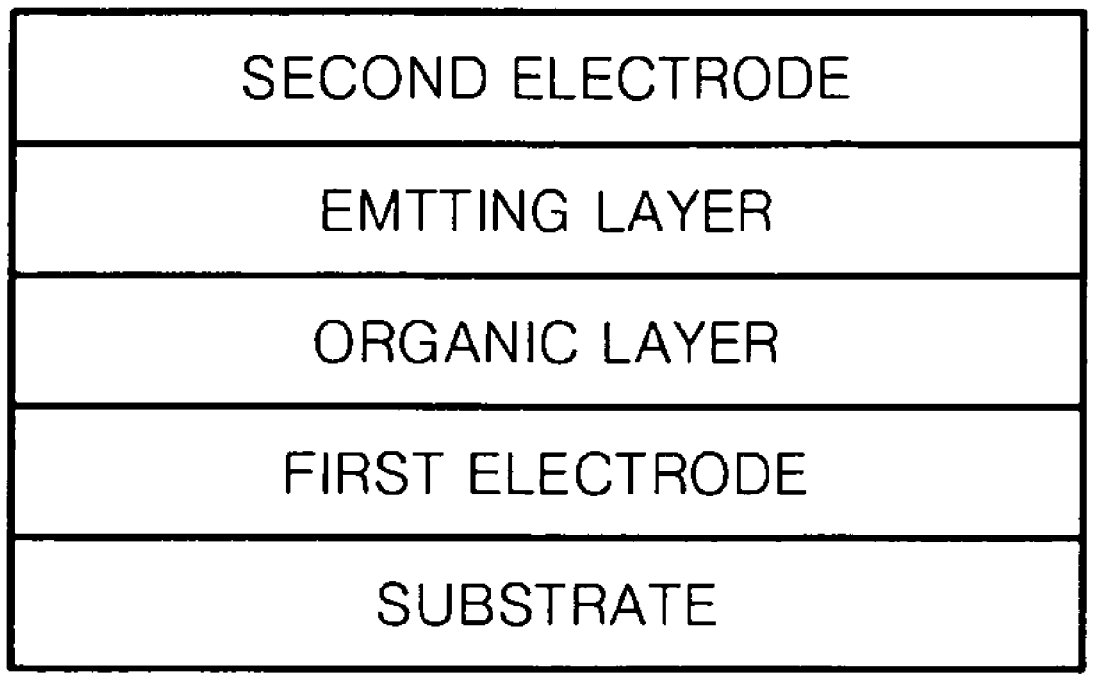
FIG. 1 is a schematic view illustrating an organic light-emitting diode according to an embodiment of the present invention.

The present invention will now be described in more detail.

A hyperbranched polymer according to the present invention is represented by Formula 1 below:

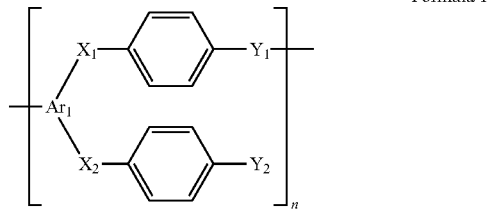

<Formula 1>

In more detail, the hyperbranched polymer of Formula 1 may have a unit A represented by Formula 1A below and a unit B represented by Formula 1B below:

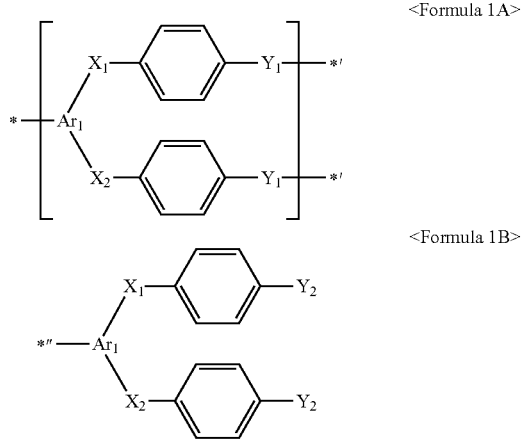

<Formula 1A>

<Formula 1B>

In Formula 1A, asterisk (*) of a unit A may be connected to *' of an adjacent unit A, and *' of the unit A may be connected to * of another adjacent unit A or *''' of an adjacent unit B. In the unit B of Formula 1B, $Y_2$ is a terminal group of the hyperbranched polymer according to the present invention. That is, in the hyperbranched polymer according to the present invention, a plurality of units A are connected to each other as described above, and a plurality of units B are connected to terminals of the interconnected units A. Thus, terminal groups of the hyperbranched polymer are $Y_2$. In the specification, such a structure is simply represented by Formula 1 above.

In Formula 1, $Ar_1$ is a substituted or unsubstituted $C_6$-$C_{20}$ arylene group or a group represented by —$(R_1)$—$N(R_2)$—$R_3$—, preferably a substituted or unsubstituted $C_6$-$C_{14}$ arylene group or a group represented by —$(R_1)$—$N(R_2)$—$R_3$—. Here, $R_1$ and $R_3$ are each independently a substituted or unsubstituted $C_6$-$C_{20}$ arylene group, preferably a substituted or unsubstituted $C_6$-$C_{14}$ arylene group, and $R_2$ is a substituted or unsubstituted $C_6$-$C_{20}$ aryl group, preferably a substituted or unsubstituted $C_6$-$C_{14}$ aryl group.

In more detail, $Ar_1$ may be one selected from structures represented in Formula 2 below, but is not limited thereto:

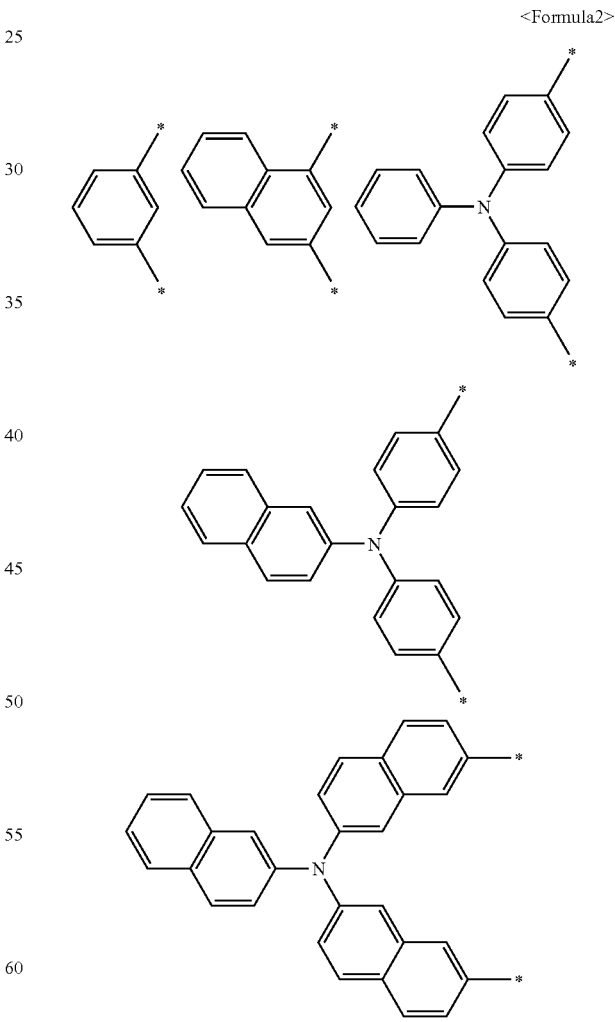

<Formula 2>

In Formula 2, two asterisks (*) in each structure represent binding positions of $X_1$ and $X_2$, respectively.

In Formula 1, $X_1$ and $X_2$ are each independently a divalent linking group selected from the group consisting of O, S, $CH_2$, CO, $SO_2$, and NHCO. Preferably, $X_1$ and $X_2$ may be each independently a divalent linking group selected from the group consisting of O, S, and $SO_2$.

In Formula 1, $Y_1$ is CO, $SO_2$, or $PO_3$.

In Formula 1, $Y_2$ is $CO_2H$, $SO_3H$, or $PO_3H$. Here, $Y_2$ is a terminal group of the hyperbranched polymer. As described above, since $Y_2$ is $CO_2H$, $SO_3H$, or $PO_3H$, an organic layer including the hyperbranched polymer can have a good adhesion with an electrode, in particular, an ITO electrode.

In Formula 1, n is an integer of 2 to 10,000, preferably an integer of 2 to 5,000. When n satisfies the above-described numerical range, the hyperbranched polymer can have good hole injection capability, etc.

According to an embodiment of the present invention, the hyperbranched polymer may be represented by Formula 3 or 4 below, but is not limited thereto:

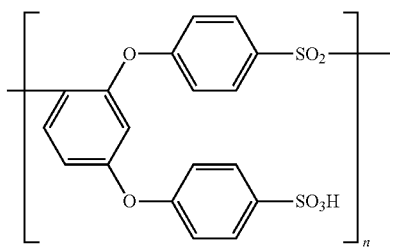

<Formula 3>

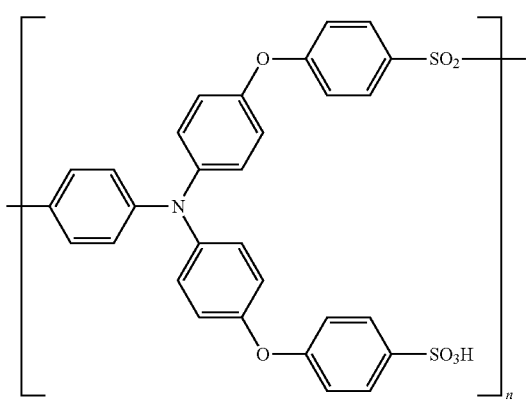

<Formula 4> wherein n is an integer of 2 to 10,000.

The above-described hyperbranched polymer has good hole injection capability and/or electron blocking capability. In addition, since the hyperbranched polymer has a terminal group selected from $CO_2H$, $SO_3H$, $PO_3H$, etc. (see $Y_2$ in Formula 1), a film including the hyperbranched polymer can have a good adhesion with an electrode, in particular an ITO electrode. Moreover, the hyperbranched polymer is dissolved in an organic solvent (e.g., dimethylformamide, etc.), and thus, a film including the hyperbranched polymer can be easily formed by a simple wet process, such as spin coating, under a moisture-free inert gas atmosphere.

The above-described hyperbranched polymer may be prepared by reacting a compound represented by Formula 5 below with a metal or a metal compound to obtain a polymer represented by Formula 6 below and reacting the polymer of Formula 6 below with a hydrogen donor:

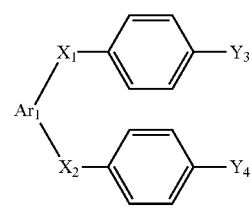

<Formula 5>

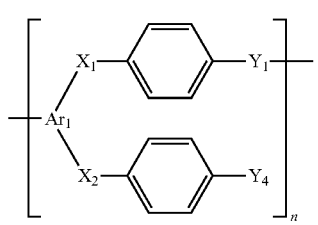

<Formula 6> wherein $Ar_1$, $X_1$, $X_2$, $Y_1$, and n are as described above.

In Formula 5, $Y_3$ and $Y_4$ may be each independently, COZ, $SO_2Z$, or $PO_3Z$. Here, Z is a halogen element such as Cl, Br, or I.

When the compound of Formula 5 reacts with the metal compound, the polymer of Formula 6 is obtained. The polymer of Formula 6 is hyperbranched like the hyperbranched polymer of Formula 1 according to the present invention. The metal compound may be a Lewis acid selected from $FeCl_3$, $AlCl_3$, $FeBr_3$, $ZnCl_2$, $BF_3$, $TiCl_3$, $SbCl_5$, $MoCl_5$, and $InCl_3$, but is not limited thereto.

When the polymer of Formula 6 reacts with the hydrogen donor, the hyperbranched polymer of Formula 1 is obtained. Here, the hydrogen donor may be water, but is not limited thereto.

In detail, the compound of Formula 5 may be Compound 1 or 2 below, but is not limited thereto:

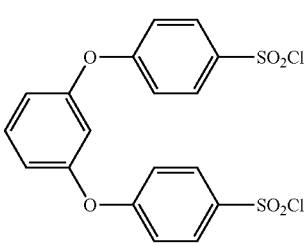

<Compound 1>

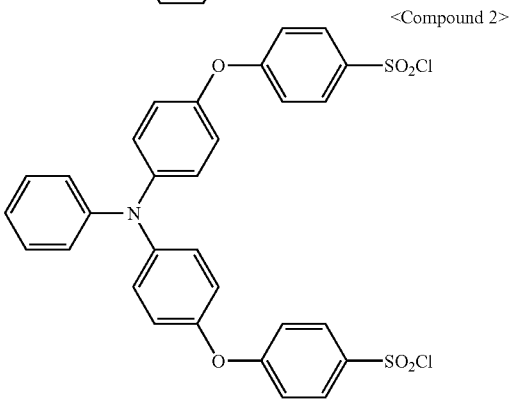

<Compound 2>

In the specification, the unsubstituted $C_6$-$C_{20}$ arylene group refers to a linking group having a carbocyclic aromatic system including at least one ring. Here, two or more rings may be attached to each other as a pendant group or may be fused. Examples of the unsubstituted $C_6$-$C_{20}$ arylene group include a phenylene group, a naphthylene group, and an anthracenylene group. At least one hydrogen of the unsubstituted $C_6$-$C_{20}$ arylene group may be substituted by a substituent such as a halogen atom, a $C_1$-$C_{30}$ alkyl group, a $C_1$-$C_{30}$ alkoxy group, a $C_1$-$C_{30}$ alkylamino group, a hydroxy group, a nitro group, a cyano group, an amino group, an amidino group, hydrazine, hydrazone, a carboxyl group, a sulfonyl group, a phosphonyl group, or the like.

The above-described hyperbranched polymer may be used in an organic light-emitting diode. Thus, an organic light-emitting diode according to the present invention includes a substrate, a first electrode, an organic layer including the above-described hyperbranched polymer of Formula 1, an emitting layer, and a second electrode.

The hyperbranched polymer has good hole injection capability and/or electron blocking capability, and thus, the organic layer including the hyperbranched polymer may be a layer having hole injection capability or a layer having hole injection capability and electron blocking capability.

The organic layer including the hyperbranched polymer may further include a known hole injection and/or transport material. The known hole injection and/or transport material may be a triphenylamine-based material. Examples of the triphenylamine-based material include, but is not limited to, 4,4',4"-tris-(carbazol-9-yl)-triphenylamine (TCTA), N,N'-bis(3-methylphenyl)-N,N'-diphenyl-[1,1-biphenyl]-4,4'-18 diamine (TPD), N,N'-di(naphthalene-1-yl)-N,N'-diphenyl benzidine (α-NPD), 4,4',4"-tris(N-3-methylphenyl-N-phenyl-amino)triphenylamine (m-MTDATA), 4,4',4"-tris(N-(2-naphthyl)-N-phenyl-amino)triphenylamine (2T-NATA), and 4,4',4"-tris(N-(1-naphthyl)-N-phenyl-amino)triphenylamine (1T-NATA).

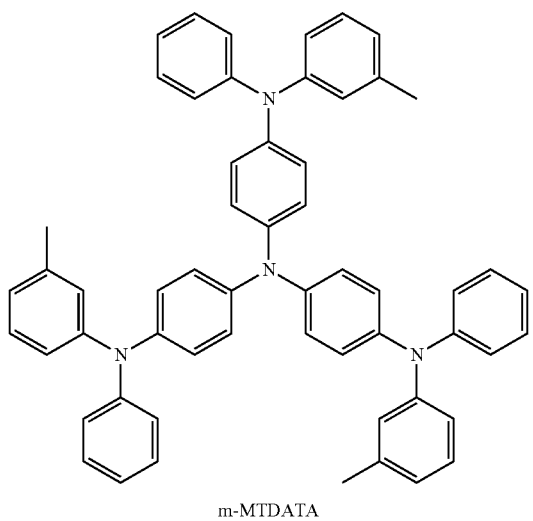

m-MTDATA

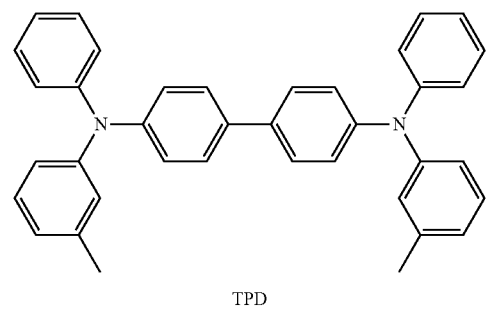

TPD

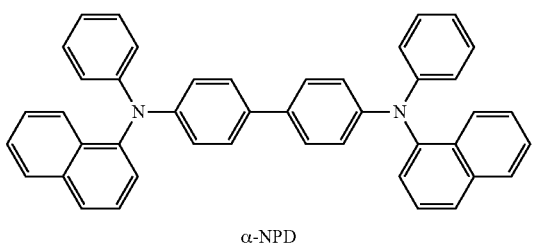

α-NPD

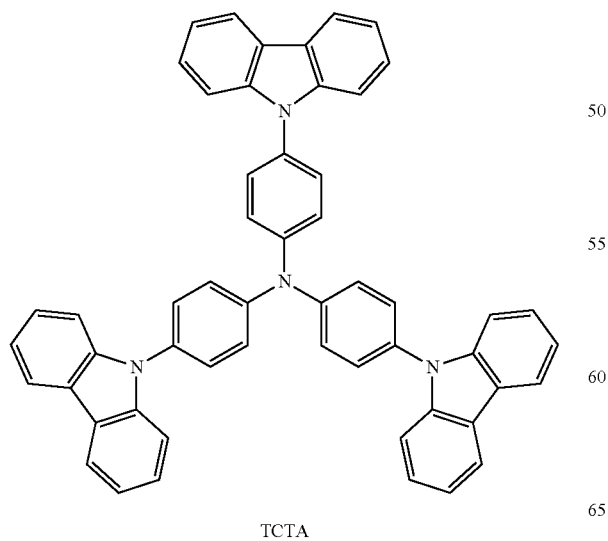

TCTA

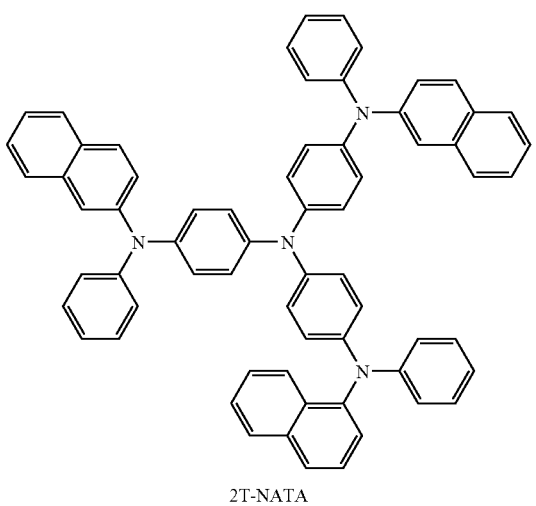

2T-NATA

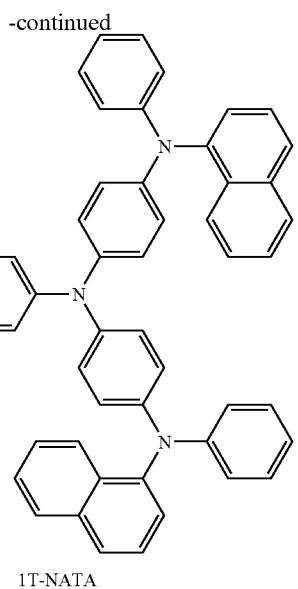

1T-NATA

As such, when the organic layer including the hyperbranched polymer further includes a known hole injection and/or transport material, the organic layer can become a layer having hole injection capability and hole transport capability or a layer having hole injection capability, hole transport capability, and electron blocking capability.

The organic layer including the hyperbranched polymer may further include a known fluorinated ionomer in order to increase the conductivity of the organic layer. For example, the organic layer including the hyperbranched polymer may further include a fluorinated ionomer disclosed in Korean Patent Laid-Open Publication No. 2006-0091220, but is not limited thereto.

The hyperbranched polymer in the organic layer has a terminal group selected from $CO_2H$, $SO_3H$, and $PO_3H$ (see $Y_2$ in Formula 1), and thus, may be present in an electrostatically self-assembled state. Thus, the organic layer including the hyperbranched polymer can have good hole injection capability.

The organic layer including the hyperbranched polymer may have a thickness of 1 to 100 nm, preferably 1 to 50 nm. When the organic layer satisfies the above thickness range, it can exhibit good hole injection capability and/or electron blocking capability without lowering a driving voltage.

If necessary, at least one layer selected from the group consisting of a hole transport layer, a hole blocking layer, an electron transport layer, and an electron injection layer may be further interposed between the first electrode and the second electrode of the organic light-emitting diode.

The hyperbranched polymer of Formula 1 is dissolved in an organic solvent. Thus, a method of manufacturing an organic light-emitting diode according to the present invention includes forming a first electrode on a substrate, forming an organic layer including the above-described hyperbranched polymer on the first electrode by coating a solution including the hyperbranched polymer and an organic solvent on the first electrode and baking the resultant under an inert gas atmosphere, forming an emitting layer on the organic layer, and forming a second electrode on the emitting layer.

The hyperbranched polymer is dissolved in an organic solvent, e.g., dimethylformamide, dimethylsulfoxide, dichloroethane, chlorobenzene, or acetonitrile. Thus, the organic layer including the hyperbranched polymer can be formed by a simple wet process, such as spin coating, under a moisture-free inert gas atmosphere. As such, since the organic layer including the hyperbranched polymer can be formed under a moisture-free condition, the hyperbranched polymer does not contain moisture as impurities, and thus, the organic light-emitting diode including the organic layer formed as described above can have good electrical properties.

The method of manufacturing the organic light-emitting diode may further include forming at least one layer selected from a hole transport layer, a hole blocking layer, an electron transport layer, and an electron injection layer.

FIG. 1 schematically illustrates an organic light-emitting diode according to an embodiment of the present invention, including a substrate, a first electrode, an organic layer including the above-described hyperbranched polymer, an emitting layer, and a second electrode. Hereinafter, an organic light-emitting diode and a method of manufacturing the same according to the present invention will be described in more detail with reference to FIG. 1.

First, a first electrode is formed on a substrate by deposition or sputtering using a first electrode material with a high work function. The first electrode may be an anode. Here, the substrate may be a substrate commonly used in organic light-emitting diodes. Preferably, the substrate may be a glass or transparent plastic substrate which is excellent in view if mechanical strength, thermal stability, transparency, surface smoothness, handling property, and water repellency. The first electrode material may be a material with transparency and good conductivity, e.g., indium tin oxide (ITO), indium zinc oxide (IZO), tin oxide ($SnO_2$), or zinc oxide (ZnO).

Next, an organic layer including the above-described hyperbranched polymer of Formula 1 is formed on the first electrode. At this time, if necessary, the organic layer may further include at least one known material selected from a hole injection material, a hole transport material, and a fluorinated ionomer, in addition to the hyperbranched polymer.

The organic layer including the hyperbranched polymer may be formed by a wet process, such as spin coating, casting, or Langmuir-Blodgett (LB) method.

When forming the organic layer including the hyperbranched polymer using spin coating, the coating conditions vary depending on the compound used, and the structure and thermal characteristics of the organic layer. However, it is preferred that the spin coating should be performed at a coating speed of about 2000 to 5000 rpm, and after the spin coating, a thermal treatment should be performed at a temperature of about 80 to 300° C. for the purpose of solvent removal.

Next, although not shown in FIG. 1, if necessary, a hole transport layer (HTL) may be further formed on the organic layer including the hyperbranched polymer using any of various methods such as vacuum deposition, spin coating, casting, or LB method.

When forming the hole transport layer using vacuum deposition, the deposition conditions vary depending on a compound used as a hole transport layer material, the desired structure and thermal characteristics of the hole transport layer, etc. However, it is preferred that the hole transport layer should be deposited at a deposition temperature of 100 to 500° C., in a vacuum level of $10^{-8}$ to $10^{-3}$ torr, and at a deposition rate of 0.01 to 100 Å/sec.

When forming the hole transport layer using spin coating, the coating conditions vary depending on the compound used, but are generally selected from the above-described deposition conditions.

The hole transport layer material may be a known hole transport material, e.g., a carbazole derivative such as N-phenylcarbazole or polyvinylcarbazole; an amine derivative having an aromatic fused ring such as N,N'-bis(3-methylphenyl)-N,N'-diphenyl-[1,1-biphenyl]-4,4'-diamine (TPD) or N,N'-di(naphthalene-1-yl)-N,N'-diphenylbenzidine (α-NPD); etc.

The hole transport layer may be formed to a thickness of about 50 to 1000 Å, preferably 100 to 600 Å. When the thickness of the hole transport layer satisfies the above range, good hole transport capability can be achieved with no reduction in deriving voltage.

Next, an emitting layer (EML) may be formed by spin coating, casting, or LB method. When forming the emitting layer using deposition or spin coating, the deposition or coating conditions vary depending on the compound used, but can be generally selected from the above-described deposition or coating conditions.

The emitting layer may be formed of any of various known emitting materials. For example, a known green light-emitting material, Alq3 may be used. Furthermore, a host-dopant system may be used. For example, the host may be CBP (4,4'-N,N'-dicarbazole-biphenyl), PVK (poly(n-vinylcarbazole)), or DSA (distyrylarylene), or the like, and the dopant may be Ir(ppy)$_3$ (ppy=phenylpyridine), but are not limited thereto.

The emitting layer may be formed to a thickness of about 100 to 1000 Å, preferably 200 to 800 Å. When the thickness of the emitting layer satisfies the above range, good emission characteristics can be achieved with no reduction in driving voltage.

Next, although not shown in FIG. 1, if necessary, at least one layer selected from a hole blocking layer, an electron transport layer, and an electron injection layer may be further formed between the emitting layer and the second electrode.

The hole blocking layer (HBL) can serve to prevent the diffusion of triplet excitons or holes of the emitting layer into the second electrode or the like. The hole blocking layer may be formed by a method such as vacuum deposition, spin coating, casting, or LB method. When forming the hole blocking layer using vacuum deposition or spin coating, the deposition or coating conditions vary depending on the compound used, but can be generally selected from the above-described deposition or coating conditions. A known available hole blocking material may be an oxadiazole derivative, a triazole derivative, a phenanthroline derivative, BCP, or the like.

The hole blocking layer may be formed to a thickness of about 50 to 1000 Å, preferably 100 to 300 Å. When the thickness of the hole blocking layer satisfies the above range, good hole blocking capability can be achieved with no reduction in driving voltage.

Next, the electron transport layer (ETL) may be formed by any of various methods such as vacuum deposition, spin coating, and casting. When forming the electron transport layer using vacuum deposition or spin coating, the deposition or coating conditions vary depending on the compound used, but can be generally selected from the above-described deposition or coating conditions. An electron transport layer material serves to stably transport electrons from an electron donor electrode (a cathode) and may be a known material such as a quinoline derivative, in particular tris(8-quinolinolate)aluminum (Alq3), TAZ, or Balq3.

The electron transport layer may be formed to a thickness of about 100 to 1000 Å, preferably 200 to 500 Å. When the thickness of the electron transport layer satisfies the above range, good electron transport capability can be achieved with no reduction in driving voltage.

The electron injection layer (EIL) may be formed on the electron transport layer in order to facilitate the injection of electrons from a cathode. An electron injection layer material is not particularly limited.

The electron injection layer material may be optionally selected from known materials such as LiF, NaCl, CsF, Li$_2$O, or BaO. The deposition conditions of the electron injection layer vary depending on the compound used, but can be generally selected from the above-described deposition conditions.

The electron injection layer may be formed to a thickness of about 1 to 100 Å, preferably 5 to 50 Å. When the thickness of the electron injection layer satisfies the above range, good electron injection capability can be achieved with no reduction in driving voltage.

Finally, the second electrode may be formed on the electron injection layer using vacuum deposition or sputtering. The second electrode may be used as a cathode. A second electrode forming material may be metal or alloy with a low work function, an electroconductive compound, or a mixture thereof. For example, the second electrode forming material may be lithium (Li), magnesium (Mg), aluminum (Al), aluminum-lithium (Al—Li), calcium (Ca), magnesium-indium (Mg—In), magnesium-silver (Mg—Ag), etc. The second electrode may also be a transmissive cathode formed of ITO or IZO to provide a top-emission type device.

Hereinafter, the present invention will be described more specifically with reference to the following examples. The following examples are only for illustrative purposes and are not intended to limit the scope of the invention.

EXAMPLES

Synthesis Example 1

Synthesis of Compound 1

Compound 1 (4,4'-(m-phenylenedioxy)bis(benzenesulfonyl chloride)) was synthesized according to Reaction Scheme 1 below:

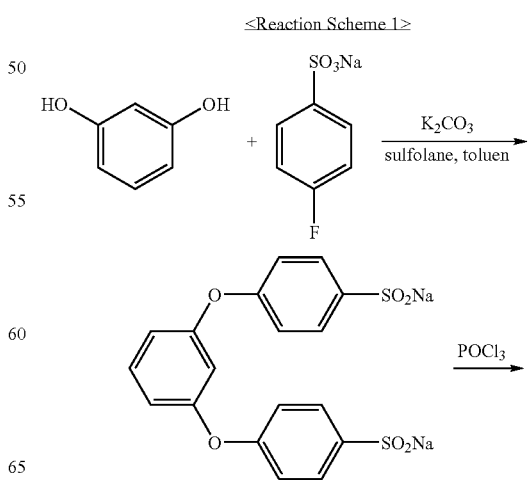

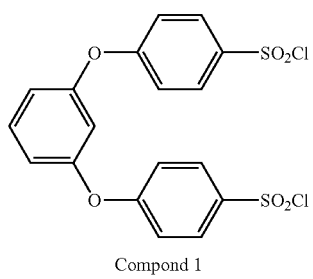

Compound 1

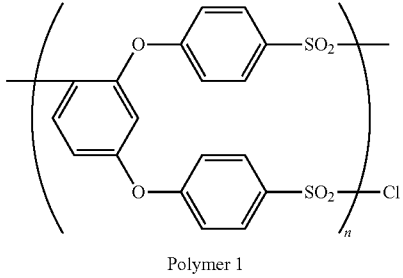

Polymer 1

Sodium P-fluorobenzenesulfonate (2.9 g, 14 mmol), resorcinol (0.66 g, 6.0 mmol), potassium carbonate (2.5 g, 18 mmol), sulfolane (24 ml), and toluene (20 ml) were put into a 100 ml round-bottomed flask equipped with a Dean-stark apparatus and a reflux condenser. The reaction mixture was heated to 150° C. for two hours, heated at 240° C. for 20 hours, and poured into dichloromethane. The resultant precipitate was dissolved in a HCl solution. The resultant solution was adjusted to pH 10 by addition of a sodium hydroxide solution, and NaCl was then added thereto to obtain 4,4'-(m-phenylenedioxy)bis(benzenesulfonic acid disodium salt). The 4,4'-(m-phenylenedioxy)bis(benzenesulfonic acid disodium salt) was recrystallized from ethanol and water and was then treated with $POCl_3$ (3 ml) at 130° C. for 6 hours. The resultant solution was poured into ice-water and then extracted with dichloromethane. A crude product was purified by column chromatography with a mixture of hexane and dichloromethane (3:2) to give Compound 1 (1.58 g, 57%) in the form of a viscous liquid.

IR (NaCl, $cm^{-1}$); 1184, 1377 (—$SO_2Cl$), 1242 (Ar—O—Ar), 1477, 1577 $cm^{-1}$ (Ph-H).

$^1$HNMR ($CDCl_3$, ppm): 6.89 (s, 1H), 7.02 (d, 2H), 7.15 (d, 4H), 7.51 (t, 1H), 8.03 (d, 4H).

Anal. ($C_{18}H_{12}Cl_2O_6S_2$): Calcd: C, 47.07%; H, 2.63%. Found: C, 47.06%; H, 2.79%.

Synthesis Example 2

Synthesis of Polymer 1

Polymer 1 (hyperbranched aromatic poly(ether sulfone) with sulfonyl chloride terminal groups) was synthesized according to Reaction Scheme 2 below:

<Reaction Scheme 2>

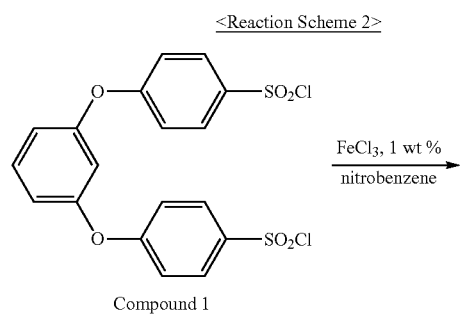

Compound 1

A solution including Compound 1 (0.30 g, 0.65 mmol), nitrobenzene (2 ml), and $FeCl_3$ (0.003 g, 0.018 mmol) was stirred at 110° C. for 3 hours. The reaction solution was cooled to room temperature and then poured into methanol containing a trace amount of a concentrated HCl solution. The resultant precipitate was washed with methanol and dried under a 80° C. vacuum atmosphere to give Polymer 1 (0.23 g, 88%).

$^1$H NMR (ppm): 8.4-6.4 (m), IR (KBr, $cm^{-1}$); 1184, 1376 (—$SO_2Cl$), 1223 (Ar—O—Ar), 1473, 1577 $cm^{-1}$ (Ph-H).

Synthesis Example 3

Synthesis of Polymer 2

Polymer 2 (poly(ether sulfone) with sulfonyl acid terminal groups) was synthesized according to Reaction Scheme 3 below:

<Reaction Scheme 3>

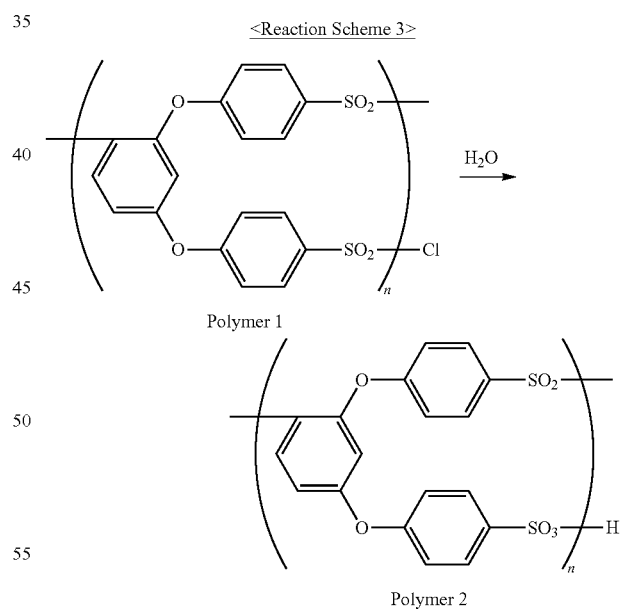

1 g of Polymer 1 was suspended in 120 ml of water in a 200 ml flask. The reaction mixture was refluxed at 100° C. for 3 hours, and water was then evaporated to give Polymer 2 (0.89 g) with a white color.

$^1$H NMR (ppm): 8.4-6.4 (M): IR (KBr, $cm^{-1}$): 1184, 1223 (Ar—O—Ar), 1473, 1577 $cm^{-1}$ (Ph-H).

TGA: 365° C. (10% weight loss); GPC: Mw=31,100, Mn=19,100, Mw/Mn=1.62

Example 1

ITO substrates were prepared. Upper surfaces of the ITO substrates had been treated with UV for 15 minutes. A solution of Polymer 2 in dimethylformamide was spin-coated on the upper surfaces of the ITO substrates in a $N_2$ glove box, and then thermally treated on hot plates in the $N_2$ glove box at 130° C. for 30 minutes and then at 200° C. for 10 minutes to form Polymer 2-containing organic layers with a thickness of 5 nm. A green light-emitting material, Alq3 (commercially available from LumTec Corp.) was deposited on the Polymer 2-containing organic layers under a vacuum atmosphere of $3\times10^{-7}$ torr or less to form emitting layers with a thickness of 60 nm. LiF and Al were sequentially deposited on the emitting layers under a vacuum atmosphere of $5\times10^{-7}$ torr or less to form electron injection layers with a thickness of 1 nm and cathodes with a thickness of 150 nm. Then, the resultant structures were sealed with glass lids via an epoxy resin to thereby complete organic light-emitting diodes (ITO/Polymer 2(5 nm)/Alq3(60 nm)/LiF(1 nm)/Al(150 nm)).

Comparative Example 1

Organic light-emitting diodes (ITO/PEDOT:PSS(60 nm)/Alq3(60 nm)/LiF(1 nm)/Al(200 nm)) were manufactured in the same manner as in Example 1 except that a PEDOT:PSS solution (Baytron P VP AI4083, H. C. Stark GmbH) was spin-coated and thermally treated under an air atmosphere to form PEDOT:PSS-containing organic layers with a thickness of 60 nm, instead of forming the Polymer 2-containing organic layers with a thickness of 5 nm by spin coating and thermally treating the solution of Polymer 2 in dimethylformamide in the $N_2$ glove box.

Comparative Example 2

Organic light-emitting diodes (ITO/Alq3(60 nm)/LiF(1 nm)/Al(200 nm)) were manufactured in the same manner as in Example 1 except that Polymer 2-containing organic layers were not formed.

Evaluation Example 1

Figure 2:
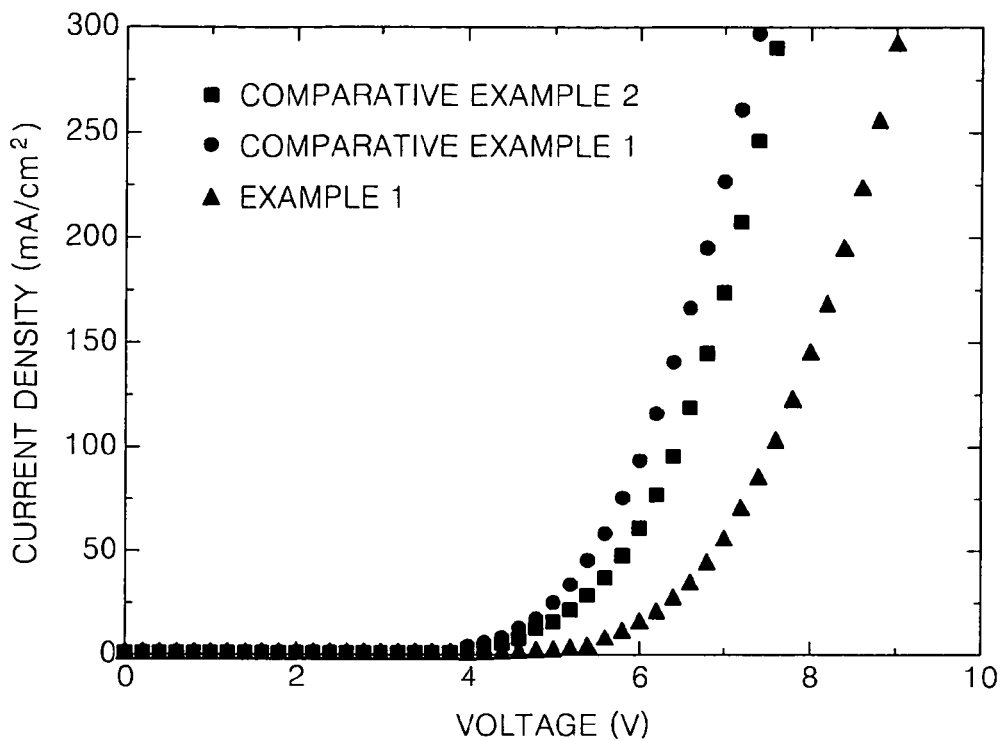
FIG. 2 is a graph illustrating current density characteristics of organic light-emitting diodes manufactured in Example 1 and Comparative Examples 1 and 2.
Figure 3:
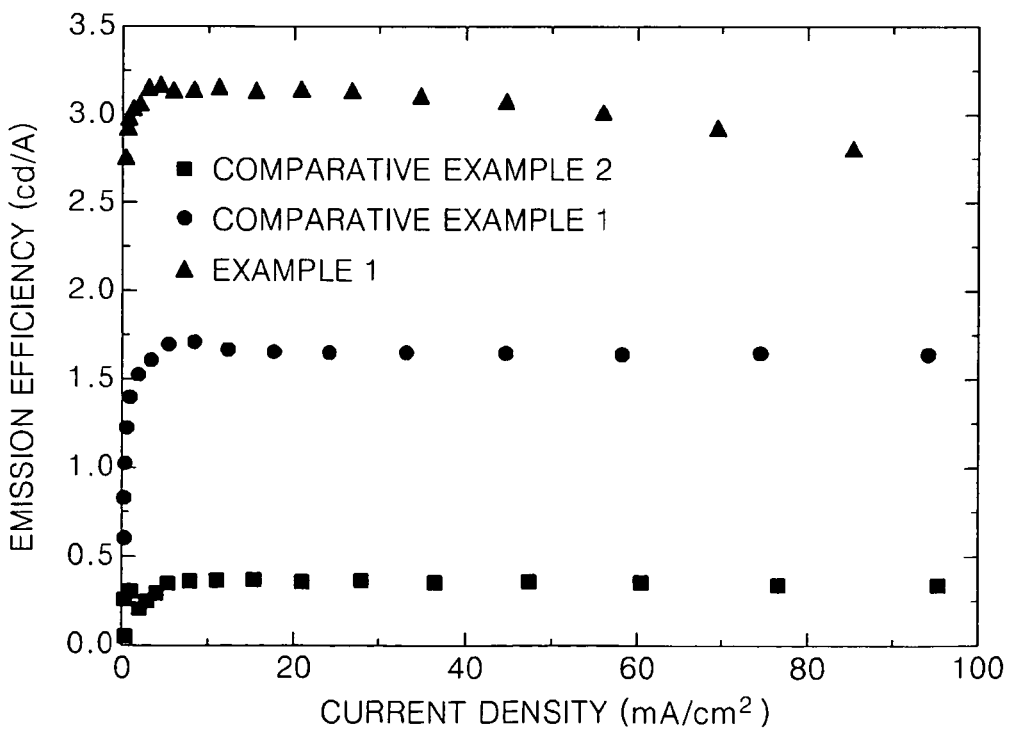
FIG. 3 is a graph illustrating emission efficiency characteristics of the organic light-emitting diodes manufactured in Example 1 and Comparative Examples 1 and 2.

Evaluation of Current-Voltage Characteristics and Emission Efficiency Characteristics The current-voltage-luminance (I-V-L) characteristics of the organic light-emitting diodes manufactured in Example 1 and Comparative Examples 1 and 2 were evaluated using a Keithley 238 source-measure unit and a Photo Research PR 650 spectrophotometer, and the results are shown in FIGS. 2 and 3.

Referring to FIGS. 2 and 3, the organic light-emitting diodes of Example 1 exhibit a slightly lower current density than the organic light-emitting diodes of Comparative Example 1, but the organic light-emitting diodes of Example 1 exhibit good luminance. Although not being limited to a particular theory, these results can be explained as follows. Since Polymer 2 used in Example 1 exhibits better electron blocking capability than PEDOT:PSS, the organic light-emitting diodes of Example 1 exhibit slightly lower current density characteristics than the organic light-emitting diodes of Comparative Example 1. Due to the electron blocking capability of Polymer 2, the organic light-emitting diodes of Example 1 can maintain a good electron-hole balance. Therefore, the organic light-emitting diodes of Example 1 exhibit better emission efficiency than the organic light-emitting diodes of Comparative Example 1.

Evaluation Example 2

Evaluation of Work Functions

The work functions of the anodes of the organic light-emitting diodes of Example 1 and Comparative Examples 1-2 were evaluated. First, the voltages at which the current under illumination in the organic light-emitting diodes of Comparative Examples 1-2 is equal to the dark current (i.e., the net photocurrent was zero) (hereinafter, referred to as "VBIs") were measured. The VBIs of the organic light-emitting diodes of Comparative Examples 1-2 are 2.05 eV and 1.70 eV, respectively, as shown in Table 1 below. Then, work functions of the organic light-emitting diodes of Comparative Examples 1-2 were measured using UV photoelectron spectroscopy (surface analyzer, Model AC2, Riken Keiki Co. Ltd., Japan). The work functions of the organic light-emitting diodes of Comparative examples 1-2 are 5.20 eV and 4.85 eV, respectively, as shown in Table 1 below. Based on the VBIs and the work functions, work function of LiF/Al was estimated to be 3.5 eV. Then, the VBIs of the organic light-emitting diodes of Example 1 were measured as described above. The VBIs of the organic light-emitting diodes of Example 1 are 1.95 eV as shown in Table 1 below. The work functions of the anodes of the organic light-emitting diodes of Example 1 were calculated by adding the work function (3.15 eV) of LiF/Al to the VBIs. The VBI evaluation graph is illustrated in FIG. 4, and the VBIs of the organic light-emitting diodes and the work functions of the anodes are summarized in Table 1 below.

TABLE 1

|  | VBI (eV) | Work function of anode (eV) |
|---|---|---|
| Example 1 | 1.95 | 5.10 |
| Comparative Example 1 | 2.05 | 5.20 |
| Comparative Example 2 | 1.70 | 4.85 |

Figure 4:
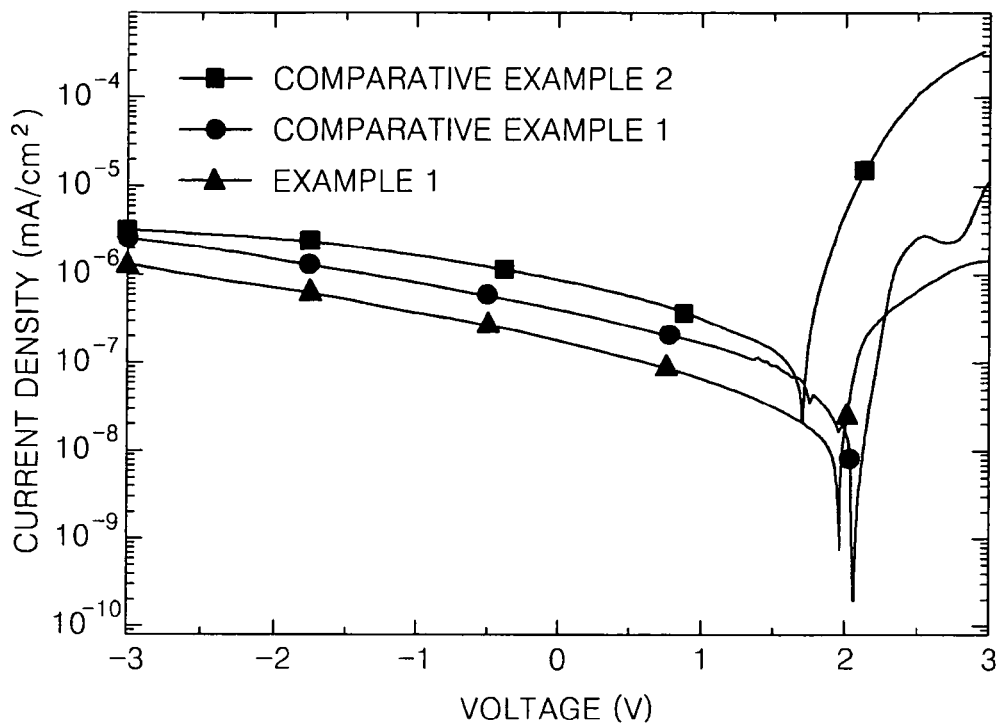
FIG. 4 is a graph illustrating photovoltaic characteristics of the organic light-emitting diodes manufactured in Example 1 and Comparative Examples 1 and 2.

As shown in FIG. 4 and Table 1, the ITO electrodes of Comparative Example 1 have a slightly higher work function than the ITO electrodes of Example 1. This shows that PEDOT:PSS has a slightly better hole injection capability than Polymer 2. This might be because Polymer 2 used in Example 1 has both hole injection capability and electron blocking capability. The electron blocking capability of Polymer 2 can be certified by Evaluation Example 3 below.

Evaluation Example 3

Evaluation of Capacitance-Voltage Characteristics

Figure 5:
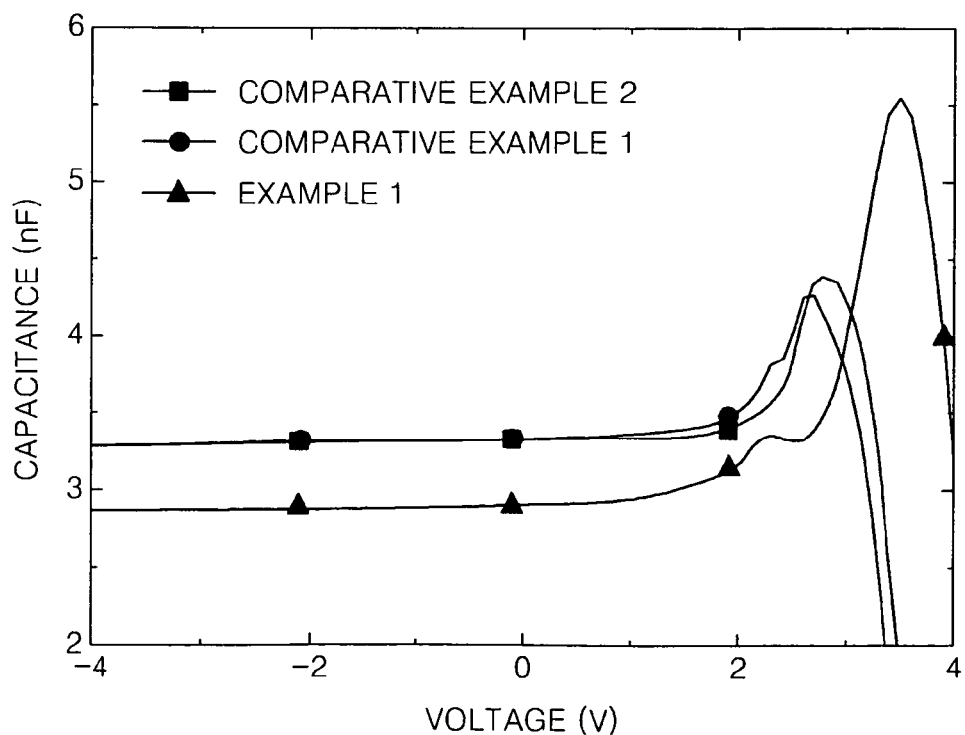
FIG. 5 is a graph illustrating capacitance characteristics of the organic light-emitting diodes manufactured in Example 1 and Comparative Examples 1 and 2.

The capacitance-voltage characteristics of the organic light-emitting diodes of Example 1 and Comparative Examples 1-2 were evaluated using an AC impedance analyzer (Solartron 1260), and the results are shown in FIG. 5. Referring to FIG. 5, the organic light-emitting diodes of Example 1 exhibit the highest maximum capacitance of about 5.5 nF. This result shows that many electrons have been accumulated at interfaces between the Alq3 emitting layers and the Polymer 2-containing organic layers in the organic light-emitting diodes of Example 1. That is, it can be seen that the electron blocking capability of the Polymer 2-containing organic layers are better than that of the PEDOT:PSS-containing organic layers of Comparative Example 1. Therefore, the organic light-emitting diodes of Example 1 can achieve an electron-hole balance, thereby providing good emission efficiency as shown in FIG. 3.

A hyperbranched polymer according to the present invention is excellent in view of hole injection capability and/or electron blocking capability and an adhesion with an electrode. Therefore, the use of the hyperbranched polymer can produce an organic light-emitting diode having good photoelectric characteristics. In addition, the hyperbranched polymer is dissolved in an organic solvent, and thus, an organic layer including the hyperbranched polymer can be formed by a simple wet process, such as spin coating, under a moisture-free inert gas atmosphere. Therefore, the organic layer including the hyperbranched polymer does not contain moisture as impurities. Since the organic layer including the hyperbranched polymer can be formed by a simple wet process, a method of manufacturing an organic light-emitting diode according to the present invention can be performed with reduced costs for a shorter time.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A hyperbranched polymer represented by Formula I below:

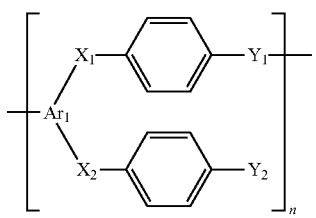

<Formula 1> wherein, $Ar_1$ is an unsubstituted $C_6$-$C_{20}$ arylene group or a group represented by —($R_1$)—N($R_2$)—$R_3$— where $R_1$ and $R_3$ are each independently a substituted or unsubstituted $C_6$-$C_{20}$ arylene group, and $R_2$ is a substituted or unsubstituted $C_6$-$C_{20}$ aryl group;

$X_1$ and $X_2$ are each independently a divalent linking group selected from the group consisting of O, S, $CH_2$, CO, $SO_2$, and NHCO;

$Y_1$ is CO, $SO_2$, or $PO_3$;

$Y_2$ is $CO_2H$, $SO_3H$, or POSH; and n is an integer of 2 to 10,000.

2. The hyperbranched polymer of claim 1, wherein $Ar_1$ is one selected from structures represented in Formula 2 below:

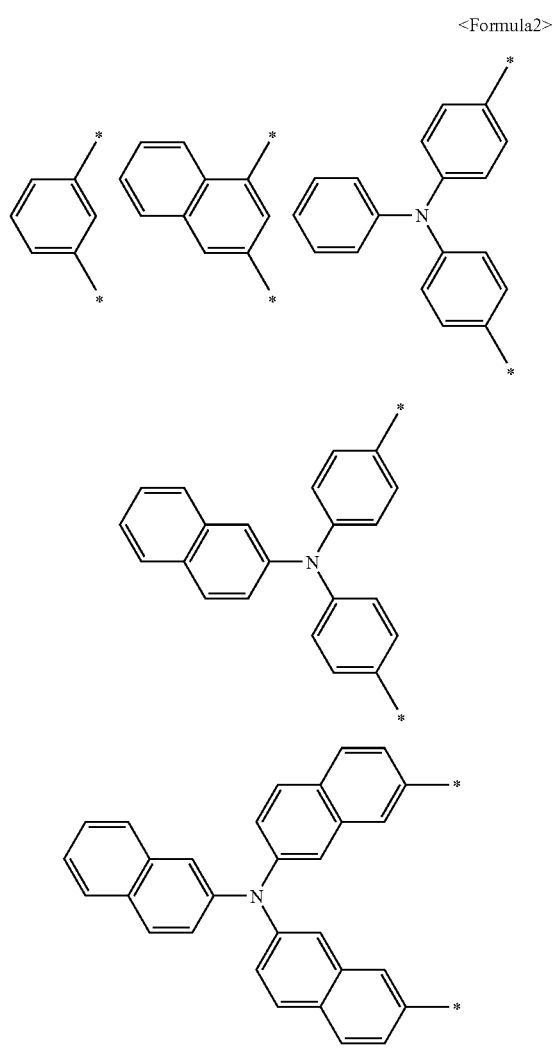

<Formula 2> wherein two asterisks (*) in each of the structures represent binding positions of $X_1$ and $X_2$, respectively.

3. The hyperbranched polymer of claim 1, wherein $X_1$ and $X_2$ are each independently a divalent linking group selected from the group consisting of O, S, and $SO_2$.

4. The hyperbranched polymer of claim 1, which is represented by Formula 3 below:

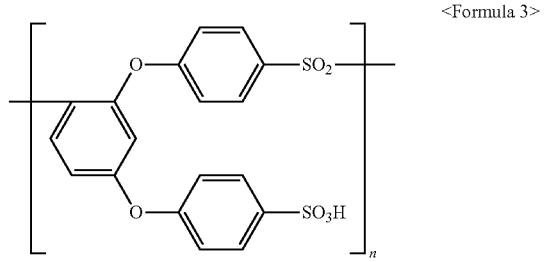

<Formula 3> wherein n is an integer of 2 to 10,000.

5. The hyperbranched polymer of claim 1, which is represented by Formula 4 below:

<Formula 4>

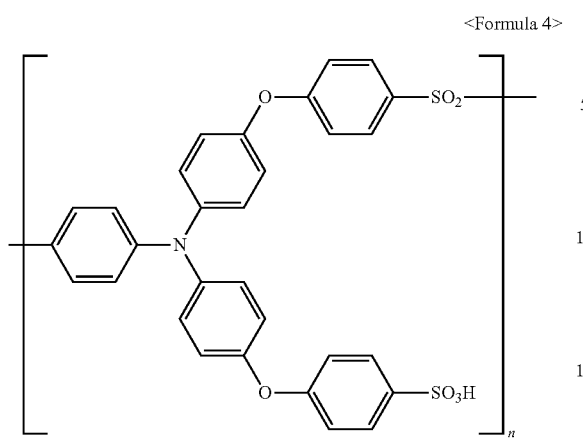

wherein n is an integer of 2 to 10,000.

6. The hyperbranched polymer of claim 1, which is prepared by reacting a compound represented by Formula 5 below with a metal or a metal compound to obtain a polymer represented by Formula 6 below and reacting the polymer of Formula 6 below with a hydrogen donor:

<Formula 5>

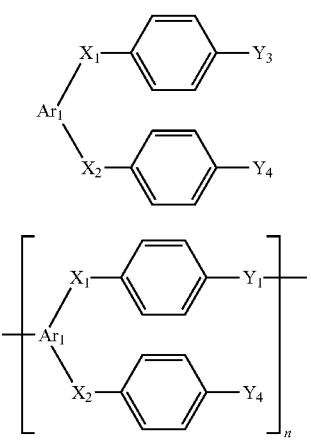

<Formula 6> wherein, $Ar_1$ is an unsubstituted $C_6$-$C_{20}$ arylene group or a group represented by —($R_1$)—N($R_2$)—$R_3$— where $R_1$ and $R_3$ are each independently a substituted or unsubstituted $C_6$-$C_{20}$ arylene group, and $R_2$ is a substituted or unsubstituted $C_6$-$C_{20}$ aryl group;

$X_1$ and $X_2$ are each independently a divalent linking group selected from the group consisting of O, S, $CH_1$, CO, $SO_2$, and NHCO;

$Y_1$ is CO, $SO_2$, or $PO_3$:

$Y_3$ and $Y_4$ are each independently COZ, $SO_2$Z, or $PO_3$Z where Z is a halogen element; and n is an integer of 2 to 10,000.

7. The hyperbranched polymer of claim 6, wherein the metal compound is selected from the group consisting of $FeCl_3$, $AlCl_3$, $FeBr_3$, $ZnCl_2$, $BF_3$, $TiCl_3$, $SbCl_5$, $MoCl_5$, and $InCl_3$.

8. The hyperbranched polymer of claim 6, wherein the compound of Formula 5 is Compound 1 or 2 below:

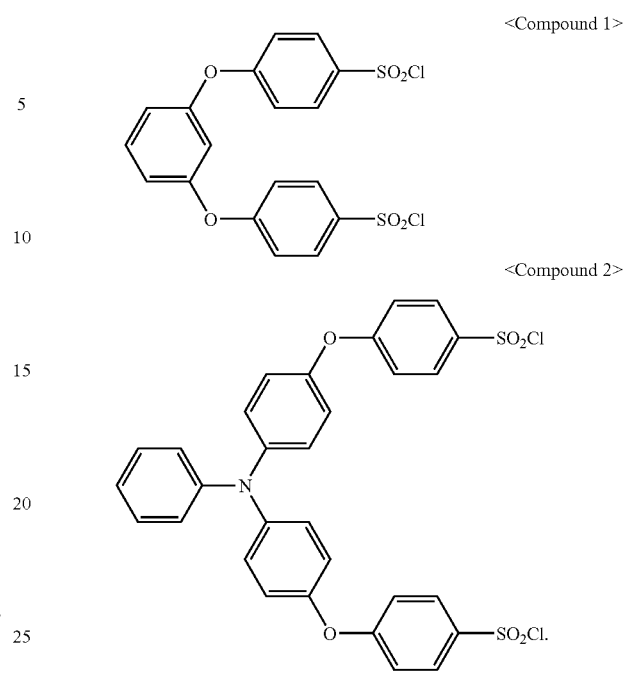

<Compound 1>

<Compound 2>

9. An organic light-emitting diode comprising:
a substrate;
a first electrode;
an organic layer comprising the hyperbranched polymer of claim 1;
an emitting layer; and
a second electrode.

10. The organic light-emitting diode of claim 9, wherein the organic layer is a layer having hole injection capability, a layer having hole injection capability and electron blocking capability, a layer having hole injection capability and hole transport capability, or a layer having hole injection capability, hole transport capability, and electron blocking capability.

11. The organic light-emitting diode of claim 9, wherein the organic layer further comprises a triphenylamine-based material.

12. The organic light-emitting diode of claim 9, wherein the organic layer further comprises a fluorinated ionomer.

13. The organic light-emitting diode of claim 9, wherein the hyperbranched polymer in the organic layer is electrostatically self-assembled.

14. The organic light-emitting diode of claim 9, wherein the organic layer has a thickness of 1 to 100 nm.

15. The organic light-emitting diode of claim 9, wherein the organic layer comprising the hyperbranched polymer is disposed on the first electrode, and the first electrode is an anode formed of Indium Tin Oxide (ITO).

16. The organic light-emitting diode of claim 9, further comprising at least one layer selected from the group consisting of a hole transport layer, a hole blocking layer, an electron transport layer, and an electron injection layer, between the first electrode and the second electrode.

17. A method of manufacturing an organic light-emitting diode, the method comprising:
forming a first electrode on a substrate:
forming an organic layer comprising the hyperbranched polymer of claim 1 on the first electrode by coating a solution comprising the hyperbranched polymer and an organic solvent on the first electrode and baking the resultant under an inert gas atmosphere;

forming an emitting layer on the organic layer; and forming a second electrode on the emitting layer.

18. The method of claim 17, wherein the organic solvent is selected from the group consisting of dimethylformamide, dimethylsulfoxide, dichloroethane, chlorobenzene, and acetonitrile.

19. The method of claim 17, further comprising forming at least one layer of a hole transport layer, a hole blocking layer, an electron transport layer, and an electron injection layer.

* * * * *